(12) United States Patent
Luo

(10) Patent No.: US 12,394,712 B2
(45) Date of Patent: Aug. 19, 2025

(54) SUPPORT STRUCTURES FOR THREE DIMENSIONAL MEMORY ARRAYS

(71) Applicant: Micron Technology, Inc., Boise, ID (US)

(72) Inventor: Shuangqiang Luo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 513 days.

(21) Appl. No.: 17/818,279

(22) Filed: Aug. 8, 2022

(65) Prior Publication Data
US 2024/0047349 A1 Feb. 8, 2024

(51) Int. Cl.
*H01L 23/528* (2006.01)
*H01L 23/535* (2006.01)
*H01L 27/11582* (2017.01)
*H10B 43/27* (2023.01)

(52) U.S. Cl.
CPC .......... *H01L 23/528* (2013.01); *H01L 23/535* (2013.01); *H10B 43/27* (2023.02)

(58) Field of Classification Search
CPC ....... H01L 23/535; H10B 41/10; H10B 43/10; H10B 41/27; H10B 43/27
See application file for complete search history.

(56) References Cited

U.S. PATENT DOCUMENTS

2022/0399274 A1* 12/2022 Iijima .................... H10B 41/27

* cited by examiner

*Primary Examiner* — John A Bodnar
(74) *Attorney, Agent, or Firm* — Holland & Hart LLP

(57) ABSTRACT

Methods, systems, and devices for support structures for three dimensional memory arrays are described. For example, a portion of a memory die may formed at least in part from a stack of material layers deposited over a substrate, and the memory die may include a set of access lines in a staircase arrangement over the stack. At least a portion of the stack of material layers between the staircase arrangement and the substrate may be configured to be continuous, or uninterrupted, which may result in fewer physical discontinuities in the stack of material layers below the staircase arrangement. In some examples, at least a portion of the stack of material layers (e.g., conductive portions) in such a region may be electrically isolated from other portions of the memory die, which may support aspects of structural support while limiting electrical interaction with the other portions of the memory die.

12 Claims, 6 Drawing Sheets

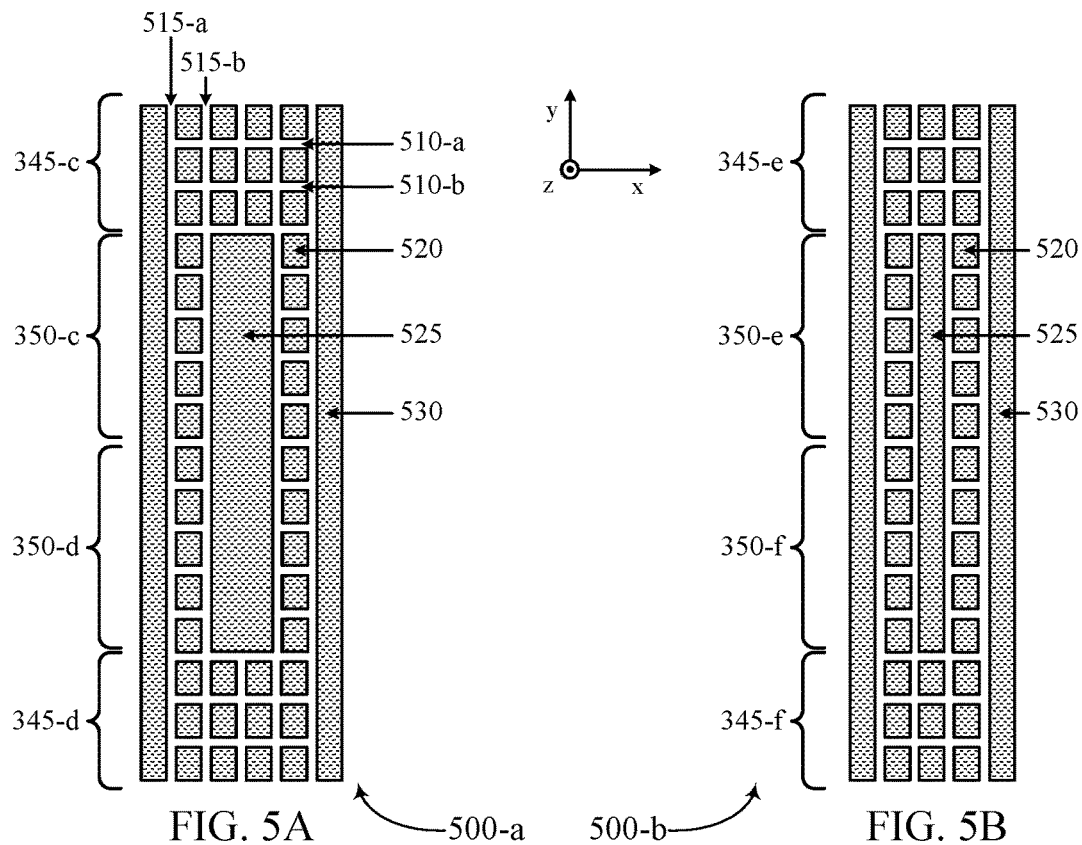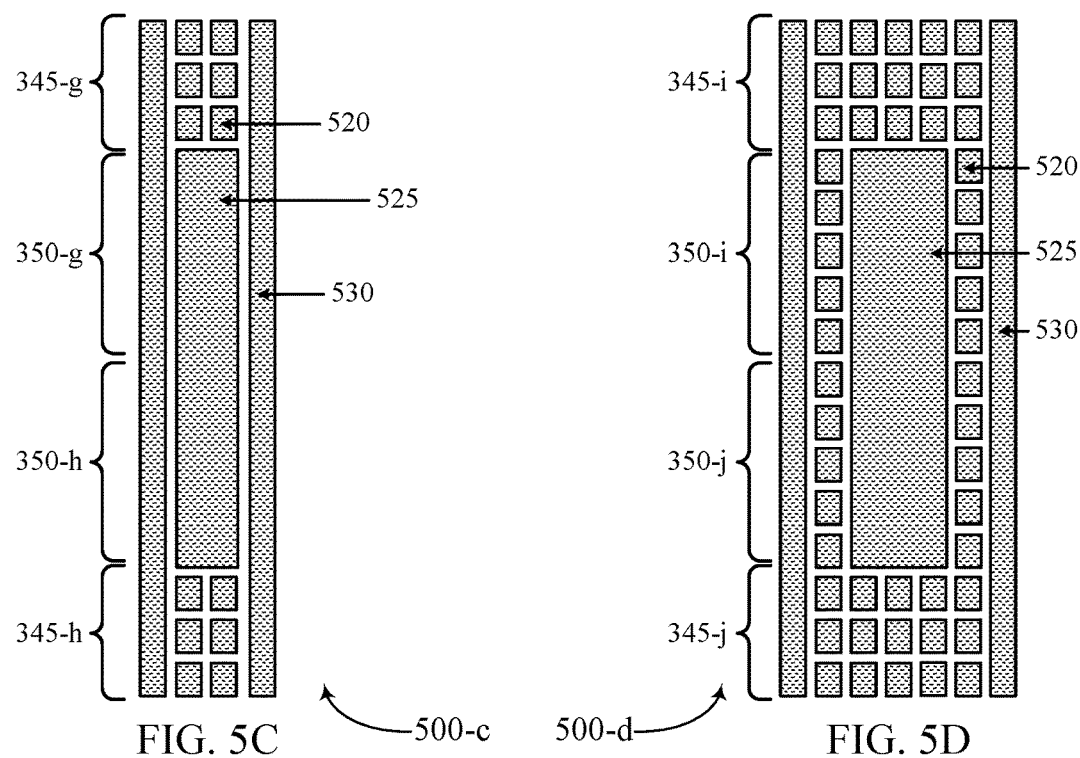

SUPPORT STRUCTURES FOR THREE DIMENSIONAL MEMORY ARRAYS

FIELD OF TECHNOLOGY

The following relates to one or more systems for memory, including support structures for three dimensional memory arrays.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

BRIEF DESCRIPTION OF THE DRAWINGS

FIGS. 5A, 5B, 5C, and 5D illustrate examples of material arrangements supporting support structures for three dimensional memory arrays in accordance with examples as disclosed herein.

DETAILED DESCRIPTION

Figure 1:
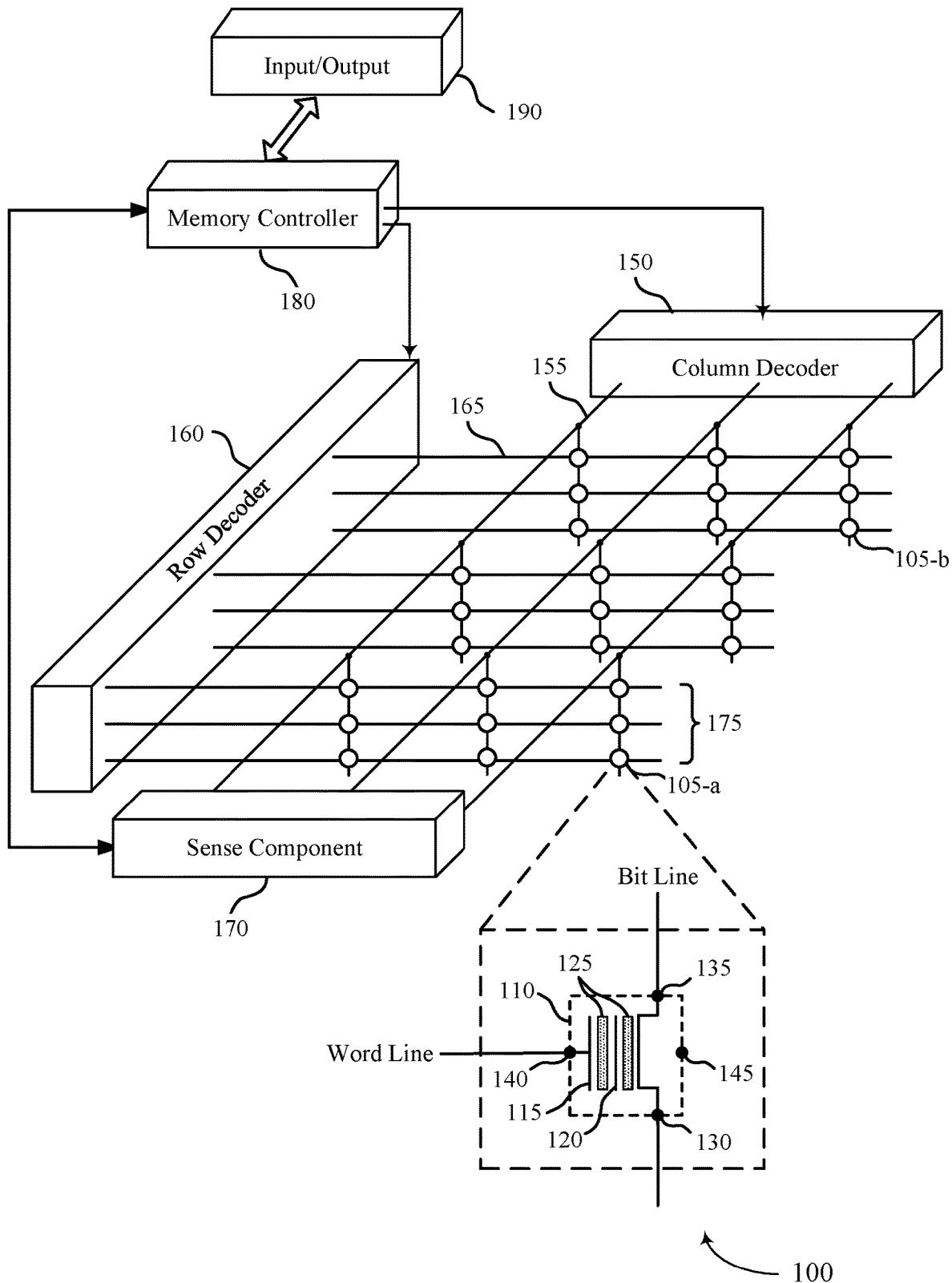
FIG. 1 illustrates an example of a system that supports support structures for three dimensional memory arrays in accordance with examples as disclosed herein.

In some memory architectures, a memory device may include a memory array arranged in a three-dimensional architecture that includes memory cells arranged according to different levels (e.g., layers, decks, planes, tiers). In some such architectures, memory cells may be accessed via one or more word lines, such that each word line may be associated with a respective level of the memory array and may be operable to access one or more memory cells at the respective level. In some examples, portions of a set of word lines may be configured in a staircase arrangement, which may be located in a region adjacent to the memory array and above a stack of material layers over a substrate (e.g., one or more materials associated with a source plate for a memory array, which may include one or more materials used as an etch stop). The staircase arrangement of the set of word lines may support vertical contacts (e.g., electrode lines, electrical contacts, vias), which may be used to access (e.g., bias, address) certain ones of the word lines associated with the memory array.

In some cases, one or more etching operations associated with forming vertical contacts may not be aligned with material layers of the stack, for example, based on one or more discontinuities in the stack of material layers (e.g., discontinuities along a direction over the substrate). As such, the etching operation(s) may etch one or more portions below the stack of material layers (e.g., portions of the memory device not intended to be etched). Additionally, or alternatively, in some cases, one or more vertical contacts of the word line staircase arrangement (e.g., in the staircase region) may be located above a respective discontinuity in the stack of material layers. In some such examples, the formation or presence of the vertical contacts may be associated with (e.g., induce) structural defects (e.g., bending, buckling, stress, deflection) in one or more word lines located above the respective discontinuity, among other defects.

In accordance with examples as disclosed herein, portions of a stack of material layers may be formed between an access line staircase arrangement and a substrate in a manner that reduces or prevents unintended etching, reduces or prevents structural defects in one or more access lines, or both. For example, at least a portion of the stack of material layers below the staircase arrangement (e.g., among other regions) may be configured to be continuous (e.g., uninterrupted along one or more direction over a substrate), which may result in fewer physical discontinuities (e.g., gaps) in the stack of material layers below the staircase arrangement. In some examples, this portion of the stack of material layers may be located beneath the vertical contacts and the access lines of the access line staircase arrangement, and, in some cases, may also extend beyond a region below the access line staircase (e.g., along one or more directions over the substrate). In some examples, at least a portion of the stack of material layers (e.g., conductive portions) may be electrically isolated (e.g., electrically floating) from other portions of the memory die, which may support aspects of structural support while limiting electrical interaction with the other portions of the memory die. Such configurations may support fewer physical interruptions in the stack of material layers, which may reduce unintended etching below the stack of material layers and may reduce structural defects in access lines of a staircase arrangement, among other features.

Figure 2:
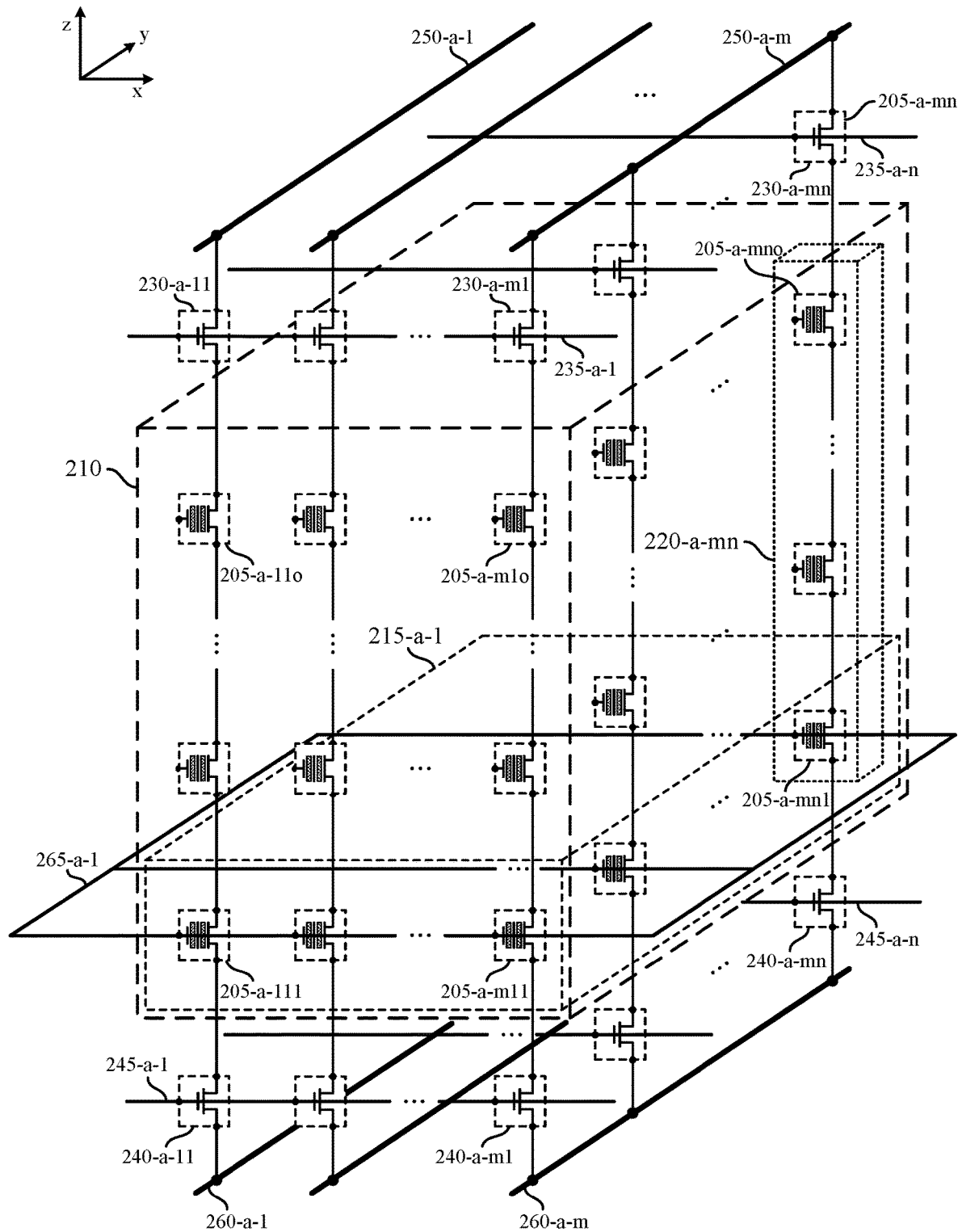
FIG. 2 illustrates an example of a memory architecture that supports support structures for three dimensional memory arrays in accordance with examples as disclosed herein.

Features of the disclosure are initially described in the context of systems, devices, and circuits with reference to FIGS. 1 and 2. Features of the disclosure are described in the context of memory architectures and material arrangements with reference to FIGS. 3 through 5D. These and other features of the disclosure are further illustrated by and described in the context of a flowchart that relate to support structures for three dimensional memory arrays with reference to FIG. 6.

FIG. 1 illustrates an example of a memory device 100 that supports support structures for three dimensional memory arrays in accordance with examples as disclosed herein. FIG. 1 is an illustrative representation of various components and features of the memory device 100. As such, the components and features of the memory device 100 are shown to illustrate functional interrelationships, and not necessarily physical positions within the memory device 100. Further, although some elements included in FIG. 1 are labeled with a numeric indicator, some other corresponding elements are not labeled, even though they are the same or would be understood to be similar, in an effort to increase visibility and clarity of the depicted features.

The memory device 100 may include one or more memory cells 105, such as memory cell 105-*a* and memory cell 105-*b*. In some examples, a memory cell 105 may be a NAND memory cell, such as in the blow-up diagram of memory cell 105-*a*. Each memory cell 105 may be programmed to store a logic value representing one or more bits of information. In some examples, a single memory cell 105—such as a memory cell 105 configured as a single-level cell (SLC)—may be programmed to one of two supported states and thus may store one bit of information at a time (e.g., a logic 0 or a logic 1). In some other examples, a single memory cell 105—such a memory cell 105 configured as a multi-level cell (MLC), a tri-level cell (TLC), a quad-level cell (QLC), or other type of multiple-level memory cell 105—may be programmed to one state of more than two supported states and thus may store more than one bit of information at a time. In some cases, a multiple-level memory cell 105 (e.g., an MLC memory cell, a TLC memory cell, a QLC memory cell) may be physically different than an SLC cell. For example, a multiple-level memory cell 105 may use a different cell geometry or may be fabricated using different materials. In some examples, a multiple-level memory cell 105 may be physically the same or similar to an SLC cell, and other circuitry in a memory block (e.g., a controller, sense amplifiers, drivers) may be configured to operate (e.g., read and program) the memory cell as an SLC cell, or as an MLC cell, or as a TLC cell, etc.

In some NAND memory arrays, each memory cell 105 may be illustrated as a transistor that includes a charge trapping structure (e.g., a floating gate, a replacement gate, a dielectric material) for storing an amount of charge representative of a logic value. For example, the blow-up in FIG. 1 illustrates a NAND memory cell 105-*a* that includes a transistor 110 (e.g., a metal-oxide-semiconductor (MOS) transistor) that may be used to store a logic value. The transistor 110 may include a control gate 115 and a charge trapping structure 120 (e.g., a floating gate, a replacement gate), where the charge trapping structure 120 may, in some examples, be between two portions of dielectric material 125. The transistor 110 also may include a first node 130 (e.g., a source or drain) and a second node 135 (e.g., a drain or source). A logic value may be stored in transistor 110 by storing (e.g., writing) a quantity of electrons (e.g., an amount of charge) on the charge trapping structure 120. An amount of charge to be stored on the charge trapping structure 120 may depend on the logic value to be stored. The charge stored on the charge trapping structure 120 may affect the threshold voltage of the transistor 110, thereby affecting the amount of current that flows through the transistor 110 when the transistor 110 is activated (e.g., when a voltage is applied to the control gate 115, when the memory cell 105-*a* is read). In some examples, the charge trapping structure 120 may be an example of a floating gate or a replacement gate that may be part of a 2D NAND structure. For example, a 2D NAND array may include multiple control gates 115 and charge trapping structures 120 arranged around a single channel (e.g., a horizontal channel, a vertical channel, a columnar channel, a pillar channel).

A logic value stored in the transistor 110 may be sensed (e.g., as part of a read operation) by applying a voltage to the control gate 115 (e.g., to control node 140, via a word line 165) to activate the transistor 110 and measuring (e.g., detecting, sensing) an amount of current that flows through the first node 130 or the second node 135 (e.g., via a bit line 155). For example, a sense component 170 may determine whether an SLC memory cell 105 stores a logic 0 or a logic 1 in a binary manner (e.g., based on a presence or absence of a current through the memory cell 105 when a read voltage is applied to the control gate 115, based on whether the current is above or below a threshold current). For a multiple-level memory cell 105, a sense component 170 may determine a logic value stored in the memory cell 105 based on various intermediate threshold levels of current when a read voltage is applied to the control gate 115, or by applying different read voltages to the control gate and evaluating different resulting levels of current through the transistor 110, or various combinations thereof. In one example of a multiple-level architecture, a sense component 170 may determine the logic value of a TLC memory cell 105 based on eight different levels of current, or ranges of current, that define the eight potential logic values that could be stored by the TLC memory cell 105.

An SLC memory cell 105 may be written by applying one of two voltages (e.g., a voltage above a threshold or a voltage below a threshold) to memory cell 105 to store, or not store, an electric charge on the charge trapping structure 120 and thereby cause the memory cell 105 store one of two possible logic values. For example, when a first voltage is applied to the control node 140 (e.g., via a word line 165) relative to a bulk node 145 (e.g., a body node) for the transistor 110 (e.g., when the control node 140 is at a higher voltage than the bulk), electrons may tunnel into the charge trapping structure 120. Injection of electrons into the charge trapping structure 120 may be referred to as programming the memory cell 105 and may occur as part of a write operation. A programmed memory cell may, in some cases, be considered as storing a logic 0. When a second voltage is applied to the control node 140 (e.g., via the word line 165) relative to the bulk node 145 for the transistor 110 (e.g., when the control node 140 is at a lower voltage than the bulk node 145), electrons may leave the charge trapping structure 120. Removal of electrons from the charge trapping structure 120 may be referred to as erasing the memory cell 105 and may occur as part of an erase operation. An erased memory cell may, in some cases, be considered as storing a logic 1. In some cases, memory cells 105 may be programmed at a page level of granularity due to memory cells 105 of a page sharing a common word line 165, and memory cells 105 may be erased at a block level of granularity due to memory cells 105 of a block sharing commonly biased bulk nodes 145.

In contrast to writing an SLC memory cell 105, writing a multiple-level (e.g., MLC, TLC, or QLC) memory cell 105 may involve applying different voltages to the memory cell 105 (e.g., to the control node 140 or bulk node 145 thereof) at a finer level of granularity to more finely control the amount of charge stored on the charge trapping structure 120, thereby enabling a larger set of logic values to be represented. Thus, multiple-level memory cells 105 may provide greater density of storage relative to SLC memory cells 105 but may, in some cases, involve narrower read or write margins or greater complexities for supporting circuitry.

A charge-trapping NAND memory cell 105 may operate similarly to a floating-gate NAND memory cell 105 but, instead of or in addition to storing a charge on a charge trapping structure 120, a charge-trapping NAND memory cell 105 may store a charge representing a logic state in a dielectric material between the control gate 115 and a channel (e.g., a channel between a first node 130 and a second node 135). Thus, a charge-trapping NAND memory cell 105 may include a charge trapping structure 120, or may implement charge trapping functionality in one or more portions of dielectric material 125, among other configurations.

In some examples, each page of memory cells 105 may be connected to a corresponding word line 165, and each column of memory cells 105 may be connected to a corresponding bit line 155 (e.g., digit line). Thus, one memory cell 105 may be located at the intersection of a word line 165 and a bit line 155. This intersection may be referred to as an address of a memory cell 105. In some cases, word lines 165 and bit lines 155 may be substantially perpendicular to one another, and may be generically referred to as access lines or select lines.

In some cases, a memory device 100 may include a three-dimensional (3D) memory array, where multiple two-dimensional (2D) memory arrays may be formed on top of one another. In some examples, such an arrangement may increase the quantity of memory cells 105 that may be fabricated on a single die or substrate as compared with 1D arrays, which, in turn, may reduce production costs, or increase the performance of the memory array, or both. In the example of FIG. 1, memory device 100 includes multiple levels (e.g., decks, layers, planes, tiers) of memory cells 105. The levels may, in some examples, be separated by an electrically insulating material. Each level may be aligned or positioned so that memory cells 105 may be aligned (e.g., exactly aligned, overlapping, or approximately aligned) with one another across each level, forming a memory cell stack 175. In some cases, memory cells aligned along a memory cell stack 175 may be referred to as a string of memory cells 105 (e.g., as described with reference to FIG. 2).

Accessing memory cells 105 may be controlled through a row decoder 160 and a column decoder 150. For example, the row decoder 160 may receive a row address from the memory controller 180 and activate an appropriate word line 165 based on the received row address. Similarly, the column decoder 150 may receive a column address from the memory controller 180 and activate an appropriate bit line 155. Thus, by activating one word line 165 and one bit line 155, one memory cell 105 may be accessed. As part of such accessing, a memory cell 105 may be read (e.g., sensed) by sense component 170. For example, the sense component 170 may be configured to determine the stored logic value of a memory cell 105 based on a signal generated by accessing the memory cell 105. The signal may include a current, a voltage, or both a current and a voltage on the bit line 155 for the memory cell 105 and may depend on the logic value stored by the memory cell 105. The sense component 170 may include various circuitry (e.g., transistors, amplifiers) configured to detect and amplify a signal (e.g., a current or voltage) on a bit line 155. The logic value of memory cell 105 as detected by the sense component 170 may be output via input/output component 190. In some cases, a sense component 170 may be a part of a column decoder 150 or a row decoder 160, or a sense component 170 may otherwise be connected to or in electronic communication with a column decoder 150 or a row decoder 160.

A memory cell 105 may be programmed or written by activating the relevant word line 165 and bit line 155 to enable a logic value (e.g., representing one or more bits of information) to be stored in the memory cell 105. A column decoder 150 or a row decoder 160 may accept data (e.g., from the input/output component 190) to be written to the memory cells 105. In the case of NAND memory, a memory cell 105 may be written by storing electrons in a charge trapping structure or an insulating layer.

A memory controller 180 may control the operation (e.g., read, write, re-write, refresh) of memory cells 105 through the various components (e.g., row decoder 160, column decoder 150, sense component 170). In some cases, one or more of a row decoder 160, a column decoder 150, and a sense component 170 may be co-located with a memory controller 180. A memory controller 180 may generate row and column address signals in order to activate a desired word line 165 and bit line 155. In some examples, a memory controller 180 may generate and control various voltages or currents used during the operation of memory device 100.

In accordance with some examples of a memory device 100, memory cells 105 may be accessed via one or more word lines 165, such that each word line 165 may be associated with a respective level of a memory array and may be operable to access one or more memory cells 105 at the respective level. For example, portions of a set of word lines 165 may be configured in a staircase arrangement, which may be located in a region adjacent to the memory array and above a stack of material layers (e.g., one or more materials associated with a source plate for a memory array). Portions of the stack of material layers may be formed between the word line staircase arrangement and a substrate in a manner that reduces or prevents unintended etching, reduces or prevents structural defects in one or more word lines 165, or both. For example, at least a portion of the stack of material layers below the staircase arrangement (e.g., among other regions) may be configured to be continuous (e.g., uninterrupted), which may result in fewer physical discontinuities (e.g., gaps) in the stack of material layers below the staircase arrangement. Such configurations may support fewer physical interruptions in the stack of material layers, which may reduce unintended etching below the stack of material layers and may reduce structural defects in word lines 165 of a staircase arrangement, among other features.

FIG. 2 illustrates an example of a memory architecture 200 that supports support structures for three dimensional memory arrays in accordance with examples as disclosed herein. The memory architecture 200 may be an example of a portion of a memory device, such as a memory device 100. Although some elements of a set of elements (e.g., an array of elements) are included in FIG. 2, some elements may be omitted for the sake of visibility and clarity of the depicted elements. Moreover, although some elements included in FIG. 2 are labeled with reference numbers, some other corresponding elements are not labeled, though they are the same or would be understood by a person having ordinary skill in the art to be similar. Aspects of the memory architecture 200 may be described with reference to an x-direction, a y-direction, and a z-direction of the illustrated coordinate system.

The memory architecture 200 includes a three-dimensional array of memory cells 205, which may be examples of memory cells 105 described with reference to FIG. 1 (e.g., transistors 110, NAND memory cells). In some examples, the memory cells 205 may be connected in a 3D NAND configuration. For example, the memory cells 205 may be included in a block 210, which may be arranged as a 3D array of m memory cells along the x-direction, n memory cells along the y-direction, and o memory cells along the z-direction. Each memory cell 205 may be located (e.g., addressed) in accordance with an index i along the x-direction, an index j along the y-direction, and an index k along the z-direction (e.g., for locating a memory cell 205-a-ijk). A memory device 100 may include any quantity of one or more blocks 210 in accordance with examples as disclosed herein, and different blocks 210 may be adjacent along the x-direction, along the y-direction, or along the z-direction, or any combination thereof.

In the example of memory architecture 200, the block 210 may be divided into a set of pages 215 (e.g., a quantity of o pages 215) along the z-direction, including a page 215-a-1 associated with memory cells 205-a-111 through 205-a-mn1. In some examples, each reference to FIG. 1), which may be coupled with a control gate 115 of each of the memory cells 205 of the page 215. For example, page 215-a-1 may be associated with a word line 265-a-1, and other pages 215-a-i may be associated with a different respective word line 265-a-i (not shown). In some examples, a word line 265 in accordance with the memory architecture 200 may be implemented as planar conductor (e.g., in an xy-plane) that is coupled with each of the memory cells 205 of the page 215.

In the example of memory architecture 200, the block 210 also may be divided into a set of strings 220 (e.g., a quantity of (m×n) strings 220) in an xy-plane, including a string 220-a-mn associated with memory cells 205-a-mn1 through 205-a-mno. In some examples, each string 220 may include a set of memory cells 205 connected in series (e.g., along the z-direction, in which a drain of one memory cell 205 in the string 220 may be coupled with a source of another memory cell 205 in the string 220). In some examples, memory cells 205 of a string 220 may be implemented along a common channel, such as a pillar channel (e.g., a columnar channel, a pillar of doped semiconductor) along the z-direction. Each memory cell 205 in a string 220 may be associated with a different word line 265, such that a quantity of word lines 265 in the memory architecture 200 may be equal to the quantity of memory cells 205 in a string 220. Accordingly, a string 220 may include memory cells 205 from multiple pages 215, and a page 215 may include memory cells 205 from multiple strings 220.

In some examples, memory cells 205 may be programmed (e.g., set to a logic 0 value) and read from in accordance with a granularity, such as at the granularity of the page 215, but may not be erasable (e.g., reset to a logic 1 value) in accordance with the granularity, such as the granularity of the page 215. For example, NAND memory may instead be erasable in accordance with a different (e.g., higher) level of granularity, such as at the level of granularity the block 210. In some cases, a memory cell 205 may be erased before it may be re-programmed. Different memory devices may have different read, write, or erase characteristics.

In some examples, each string 220 of a block 210 may be coupled with a respective transistor 230 (e.g., a string select transistor, a drain select transistor) at one end of the string 220 (e.g., along the z-direction) and a respective transistor 240 (e.g., a source select transistor, a ground select transistor) at the other end of the string 220. In some examples, a drain of each transistor 230 may be coupled with a bit line 250 of a set of bit lines 250 associated with the block 210, where the bit lines 250 may be examples of bit lines 155 described with reference to FIG. 1. A gate of each transistor 230 may be coupled with a select line 235 (e.g., a string select line, a drain select line). Thus, a transistor 230 may be used to couple a string 220 with a bit line 250 based on applying a voltage to the select line 235, and thus to the gate of the transistor 230. Although illustrated as separate lines along the x-direction, in some examples, select lines 235 may be common to all the transistors 230 associated with the block 210 (e.g., a commonly biased string select node). For example, like the word lines 265 of the block 210, select lines 235 associated with the block 210 may, in some examples, be implemented as a planar conductor (e.g., in an xy-plane) that is coupled with each of the transistors 230 associated with the block 210.

In some examples, a source of each transistor 240 associated with the block 210 may be coupled with a source line 260 of a set of source lines 260 associated with the block 210. In some examples, the set of source lines 260 may be associated with a common source node (e.g., a ground node) corresponding to the block 210. A gate of each transistor 240 may be coupled with a select line 245 (e.g., a source select line, a ground select line). Thus, a transistor 240 may be used to couple a string 220 with a source line 260 based on applying a voltage to the select line 245, and thus to the gate of the transistor 240. Although illustrated as separate lines along the x-direction, in some examples, select lines 245 also may be common to all the transistors 240 associated with the block 210 (e.g., a commonly biased ground select node). For example, like the word lines 265 of the block 210, select lines 245 associated with the block 210 may, in some examples, be implemented as a planar conductor (e.g., in an xy-plane) that is coupled with each of the transistors 240 associated with the block 210.

To operate the memory architecture 200 (e.g., to perform a program operation, a read operation, or an erase operation on one or more memory cells 205 of the block 210), various voltages may be applied to one or more select lines 235 (e.g., to the gate of the transistors 230), to one or more bit lines 250 (e.g., to the drain of one or more transistors 230), to one or more word lines 265, to one or more select lines 245 (e.g., to the gate of the transistors 240), to one or more source lines 260 (e.g., to the source of the transistors 240), or to a bulk for the memory cells 205 (not shown) of the block 210. In some cases, each memory cell 205 of a block 210 may have a common bulk, the voltage of which may be controlled independently of bulks for other blocks 210.

In some cases, as part of a read operation for a memory cell 205, a positive voltage may be applied to the corresponding bit line 250 while the corresponding source line 260 may be grounded or otherwise biased at a voltage lower than the voltage applied to the bit line 250. In some examples, voltages may be concurrently applied to the select line 235 and the select line 245 that are above the threshold voltages of the transistor 230 and the transistor 240, respectively, for the memory cell 205, thereby activating the transistor 230 and transistor 240 such that a channel associated with the string 220 that includes the memory cell 205 (e.g., a pillar channel) may be electrically connected with (e.g., electrically connected between) the corresponding bit line 250 and source line 260. A channel may be an electrical path through the memory cells 205 in the string 220 (e.g., through the sources and drains of the transistors in the memory cells 205 of the string 220) that may conduct current under some operating conditions.

In some examples, multiple word lines 265 (e.g., in some cases all word lines 265) of the block 210—except a word line 265 associated with a page 215 of the memory cell 205 to be read—may concurrently be set to a voltage (e.g., VREAD) that is higher than the threshold voltage (VT) of the memory cells 205. VREAD may cause all memory cells 205 in the unselected pages 215 be activated so that each unselected memory cell 205 in the string 220 may maintain high conductivity within the channel. In some examples, the word line 265 associated with the memory cell 205 to be read may be set to a voltage, VTarget. Where the memory cells 205 are operated as SLC memory cells, VTarget may be a voltage that is between (i) VT of a memory cell 205 in an erased state and (ii) VT of a memory cell 205 in a programmed state.

When the memory cell 205 to be read exhibits an erased VT (e.g., VTarget>VT of the memory cell 205), the memory cell 205 may turn "ON" in response to the application of VTarget to the word line 265 of the selected page 215, which may allow a current to flow in the channel of the string 220, and thus from the bit line 250 to the source line 260. When the memory cell 205 to be read exhibits a programmed VT (e.g., VTarget<VT of the selected memory cell), the memory cell 205 may remain "OFF" despite the application of VTarget to the word line 265 of the selected page 215, and thus may prevent a current from flowing in the channel of the string 220, and thus from the bit line 250 to the source line 260.

A signal on the bit line 250 for the memory cell 205 (e.g., an amount of current below or above a threshold) may be sensed (e.g., by a sense component 170 as described with reference to FIG. 1), and may indicate whether the memory cell 205 became conductive or remained non-conductive in response to the application of VTarget to the word line 265 of the selected page 215. The sensed signal thus may be indicative of whether the memory cell 205 was in an erased state (e.g., storing a logic 1) or a programmed state (e.g., storing a logic Though aspects of the example read operation above have been explained in the context of an SLC memory cell 205 for clarity, such techniques may be extended or altered and applied in the context of a multiple-level memory cell 205 (e.g., through the use of multiple values of VTarget corresponding to the different amounts of charge that may be stored in one multiple-level memory cell 205).

In some cases, as part of a program operation for a memory cell 205, charge may be added to a portion of the memory cell 205 such that current flow through the memory cell 205, and thus the corresponding string 220, may be inhibited when the memory cell 205 is later read. For example, charge may be injected into a charge trapping structure 120 as shown in memory cell 105-a of FIG. 1. In some cases, respective voltages may be applied to the word line 265 of the page 215 and the bulk of the memory cell 205 to be programmed such that a control gate 115 of the memory cell 205 is at a higher voltage than the bulk of the memory cell 205 (e.g., a positive voltage may be applied to the word line). Concurrently, voltages may be applied to the select line 235 and the select line 245 that are above the threshold voltages of the transistor 230 and the transistor 240, respectively, thereby activating the transistor 230 and the transistor 240, and the bit line 250 for the memory cell 205 to be programmed may be set to a relatively high voltage. This may cause an electric field such that electrons are pulled from the source of the memory cell 205 towards the drain. The electric field may also cause some of these electrons to be pulled through dielectric material 125 and thereby injected into the charge trapping structure 120 of the memory cell 205, through a process which may in some cases be referred to as tunnel injection.

In some cases, a single program operation may program some or all memory cells 205 in a page 215, as the memory cells 205 of the page 215 may all share a common word line 265 and a common bulk. For a memory cell 205 of the page 215 for which it is not desired to write a logic 0 (e.g., not desired to program the memory cell 205), the corresponding bit line 250 may be set to a relatively low voltage (e.g., ground), which may inhibit the injection of electrons into a charge trapping structure 120. Though aspects of the example program operation above have been explained in the context of an SLC memory cell 205 for clarity, such techniques may be extended and applied to the context of a multiple-level memory cell 205 (e.g., through the use of multiple programming voltages applied to the word line 265, or multiple passes or pulses of a programming voltage applied to the word line 265, corresponding to the different amounts of charge that may be stored in one multiple-level memory cell 205).

In some cases, as part of an erase operation for a memory cell 205, charge may be removed from a portion of the memory cell 205 such that current flow through the memory cell 205, and thus the corresponding string 220, may be uninhibited (e.g., allowed, at least to a greater extent) when the memory cell 205 is later read. For example, charge may be removed from a charge trapping structure 120 as shown in memory cell 105-a of FIG. 1. In some cases, respective voltages may be applied to the word line 265 of the page 215 and the bulk of the memory cell 205 to be erased such that a control gate 115 of the memory cell 205 is at a lower voltage than the bulk of the memory cell 205 (e.g., a positive voltage may be applied to the bulk), which may cause an electric field that pulls electrons out of the charge trapping structure 120 and into the bulk of the memory cell 205. In some cases, a single program operation may erase all memory cells 205 in a block 210, as the memory cells 205 of the block 210 may all share a common bulk.

In some examples of the memory architecture 200, portions of a set of word lines 265 may be configured in a staircase arrangement, which may be located in a region adjacent to the memory array and above a stack of material layers (e.g., one or more materials associated with a source plate for a memory array). Portions of the stack of material layers may be formed between the word line staircase arrangement and a substrate in a manner that reduces or prevents unintended etching, reduces or prevents structural defects in one or more word lines 265, or both. For example, at least a portion of the stack of material layers below the staircase arrangement (e.g., among other regions) may be configured to be continuous (e.g., uninterrupted), which may result in fewer physical discontinuities (e.g., gaps) in the stack of material layers below the staircase arrangement. Such configurations may support fewer physical interruptions in the stack of material layers, which may reduce unintended etching below the stack of material layers and may reduce structural defects in word lines 265 of a staircase arrangement, among other features.

Figure 3:
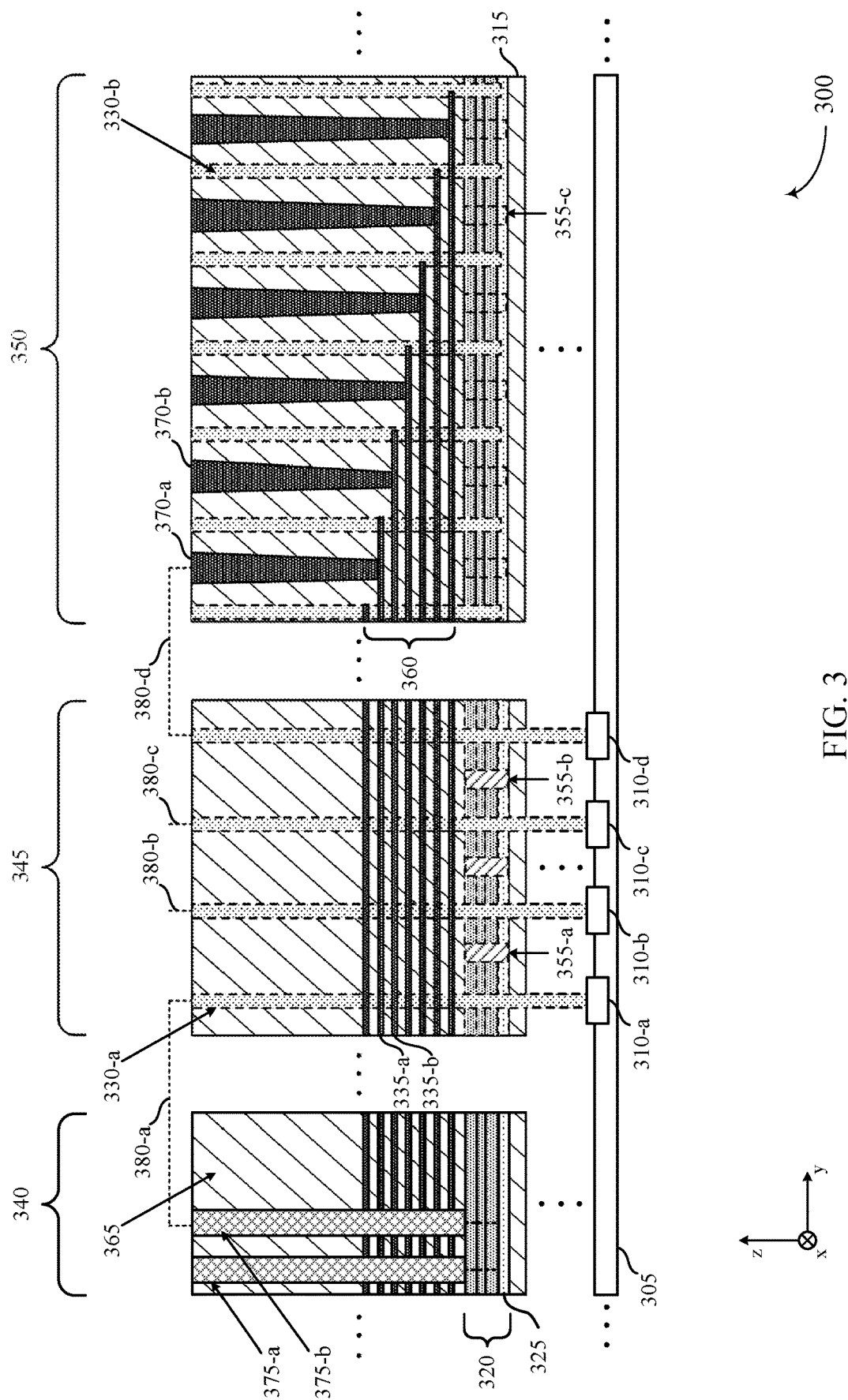
FIG. 3 illustrates an example of a memory architecture that supports support structures for three dimensional memory arrays in accordance with examples as disclosed herein.

FIG. 3 illustrates an example of a memory architecture 300 that supports support structures for three dimensional memory arrays in accordance with examples as disclosed herein. The memory architecture 300 may be an example for implementing aspects of a memory device 100 or a memory architecture 200 described with reference to FIGS. 1 and 2, respectively. For example, the memory architecture 300 may be an example of a portion of a memory device 100 or a memory device that implements the memory architecture 200. Some elements of the memory architecture 300, or elements associated with the memory architecture 300, may be omitted for the sake of visibility and clarity of the depicted elements. Moreover, although some elements included in FIG. 3 are labeled with reference numbers, some other corresponding elements are not labeled, though they are the same or would be understood by a person of ordinary skill in the art to be similar. Aspects of the memory architecture 300 may be described with reference to an x-direction (e.g., a direction over a substrate 305), a y-direction (e.g., another direction over the substrate 305), and a z-direction (e.g., a direction from the substrate 305, a thickness direction, a height direction) of the illustrated coordinate system, which may correspond to the respective directions described with reference to the memory architecture 200. Although the memory architecture 300 is illustrated in cross-section (e.g., along a yz-plane), some components illustrated by FIG. 3 may not be located at a same location along the x-direction as other illustrated components of FIG. 3. For example, components shown with dashed lines may represent components at a different location along the x-direction (e.g., into or out of the page) than other components illustrated in FIG. 3.

The memory architecture 300 may include a substrate 305, over which various materials, structures, and regions may be formed. For example, the memory architecture 300 may include circuitry 310 (e.g., circuitry 310-a, 310-b, 310-c, and 310-d), which may be formed at least in part from portions of the substrate 305 (e.g., formed over the substrate 305, formed from the substrate 305, or both). In some examples, circuitry 310 may include doped portions of the substrate 305 (e.g., one or more portions of doped semiconductor, such as doped crystalline semiconductor of a semiconductor wafer), which may support various transistor configurations of the circuitry 310. In various examples, circuitry 310 may include voltage supply circuitry, decoding circuitry, access line circuitry, circuitry of a column decoder 150, circuitry of a row decoder 160, circuitry of a sense component 170, circuitry of a memory controller 180, or circuitry of an input/output component 190, among other circuitry for operating a memory die that implements the memory architecture 300. The circuitry 310 may couple with or decouple from (or a combination of both) a voltage source that may be applied to other portions (e.g., access lines, circuitry components) of the memory architecture 300. In some examples, the circuitry 310 may be associated with accessing or operating memory cells 105 of a memory device 100 that implements memory architecture 300, and may be referred to as complementary metal oxide semiconductor (CMOS) circuitry (e.g., CMOS under array (CuA) circuitry).

The memory architecture 300 also may include one or more materials formed over the substrate 305. For example, a layer of a material 315 (e.g., a dielectric material) may be formed over the substrate 305. The memory architecture 300 also may include a stack 320 of one or more material layers, which may be formed over the substrate 305 (e.g., above the substrate, above one or more materials that are above the substrate, over the material 315). For example, the stack 320 may include a layer of a material 325 (e.g., a conductive material, a routing layer), which may support coupling components of the memory device with the circuitry 310, with associated contacts 330 (e.g., electrical contacts, vertical electrodes), word line conductors 335 (e.g., word line conductor 335-a, word line conductor 335-b, which may each be an example of a portion of a respective word line 265), bit lines 250, or a combination thereof.

The stack 320 (e.g., including the material 325) may be formed along an xy-plane over the substrate 305 with a thickness along the z-direction. The stack 320 (e.g., including the material 325) may be included in various regions (e.g., a region 340, a region 345, a region 350) of the memory architecture 300. For example, the material 325 may be included in the region 340 (e.g., an array region, a region including an array of memory cells 205), and may be associated with accessing aspects of accessing memory cells 205. The stack 320 also may be included in the region 350 (e.g., a staircase region, a region associated with different extents of word line conductors 335), which may be associated with one or more portions of the stack 320 that are relatively more contiguous, or are otherwise associated with fewer discontinuities, such that one or more relatively larger islands of the stack 320 are formed. The stack 320 may also be included in the region 345 (e.g., an island region), which may be associated with discontinuities 355 (e.g., discontinuities 355-a, discontinuities 355-b, trenches, trench isolation regions) in the stack 320, such that relatively smaller islands of the stack 320 are formed. In some examples, the material 325 may be a metal material, such as an alloy of tungsten (e.g., tungsten silicide). In some examples, the stack 320 may also include one or more other materials layered with (e.g., over) the metal material (e.g., in three or four layers).

In the region 340, the material 325 of the stack 320 may couple with a source voltage (e.g., as a source node, an example of one or more source lines 260), associated with one or more memory cells 205 of a memory array. As such, in some cases, the material 325, or the stack 320, or both in the region 340 may be referred to as a source plate (e.g., associated with the memory array). In the region 350, the material 325 may be electrically floating (e.g., electrically disconnected from other conductors).

In some examples, removal (e.g., etching) operations may be performed on the stack 320 after its formation, such that a portion of the stack 320 may include the discontinuities 355 along one or more directions in an xy-plane. The discontinuities 355 may include forming trenches (e.g., material removal along the z-direction) via openings extending along the x-direction, along the y-direction, or both, such that portions of the stack 320 may be separated into islands. For example, a portion of the stack 320 may be etched such that this portion may include the discontinuities 355 (e.g., forming islands) along one or more directions in the xy-plane. For example, each island may be formed based on removing one or more layers of the stack 320 (e.g., all layers of the stack 320) from a respective perimeter around each island (e.g., by forming trenches along the x-direction, the y-direction, or both). However, in some examples, a portion of the stack 320 (e.g., a portion of the stack in the region 350) may not be etched after being formed and may not include discontinuities 355, thus resulting in a larger, more continuous area (e.g., a relatively large island) in an xy-plane. In some examples, a relatively large area (e.g., a relatively large island) may be formed, for example, based on removing portions (e.g., one or more layers, all layers) of the stack 320 from the perimeter of the large island.

The memory architecture 300 may include a staircase structure 360 (e.g., a staircase arrangement) for the word line conductors 335, which may be formed above a portion of the stack 320 in the region 350. For example, a material 365 (e.g., a fill material, a dielectric material) may be formed (e.g., deposited over the stack 320, which may include a deposition of one or more layers of the material 365). Subsequently, voids may be formed in the material 365 (e.g., between layers of the material 365), and a conductive material may be deposited in the cavities to form the word line conductors 335. The word line conductors 335 may be formed such that they extend through at least a portion of the region 340, of the region 345, and of the region 350 along the y-direction (e.g., between layers of the material 365). Each word line conductor 335 of the staircase structure 360 may have a different extent (e.g., length) along the y-direction. Each word line conductor 335 may be associated with a respective level (e.g., deck, layer, along the z-direction) of the memory array in the region 340, such as a respective page 215, and may be utilized to access one or more memory cells 205 of the memory array.

Each of the word line conductors 335 may be coupled (e.g., electrically coupled, physically coupled) with a respective contact 370 (e.g., an electrical contact, a word line contact, a vertical electrode), and each of the contacts 370 may be operable to apply a voltage to a respective word line conductor 335 (e.g., an access bias, a read bias, a write bias). In some examples, one or more of the contacts 370 may be formed by removing (e.g., etching) the material 365 along the z-direction until a word line conductor 335 is exposed, and depositing a conductive material in the resulting cavity. Each of the contacts 370 may be coupled with a respective word line conductor 335 at a different level (e.g., layer) of the staircase structure 360, and may be utilized in accessing the respective word line conductor 335 and associated memory cell(s). For example, a contact 370-a may be coupled with a word line conductor 335-a and a contact 370-b may be coupled with a word line conductor 335-b, where both the word line conductor 335-a and the word line conductor 335-b may be coupled with (e.g., electrically coupled, physically coupled) respective memory cells of one or more pillars 375 (e.g., pillar 375-a, pillar 375-b) of the region 340 (e.g., a page 215 of the region 340).

The region 340 may include multiple pillars 375 formed over the substrate 305. The pillars 375 may include a material that supports a channel of a set of one or more memory cells 205 (e.g., transistor channels of one or more memory cells 205), and may be coupled with at least a portion of the stack 320 (e.g., the source plate, the material 325) located below the respective pillar 375. For example, each pillar 375 may be associated with a string 220 of memory cells 205, and may include at least a semiconductor material that forms the channel through the string 220. The semiconductor material may be coupled with the source plate or material 325 of the stack 320 in the region 340 (e.g., via a transistor 240). In some cases, each pillar 375 may also include a charge trapping material (e.g., a charge trapping structure 120), which may be operable to store a charge indicative (e.g., related to) a logic state stored at a respective memory cell. In some other cases, a charge trapping material (e.g., charge trapping structure 120) may be located between dielectric layers adjacent to a respective pillar 375 (e.g., between layers of the material 365).

In some examples, the word line conductors 335 located in the region 340 may be coupled with respective portions (e.g., memory cells 205) of the pillars 375. As such, each of the word line conductors 335 may be operable to modulate the conductivity of the portion of each pillar 375 it is coupled with, which may support access operations of a memory cell 205 associated with a pillar 375 (e.g., to support a write operation associated with a portion of the pillar 375, to support a read operation associated with a portion of a pillar 375). For example, word line conductors 335 may be operable as a gate portion of one or more transistor structures associated with the pillars 375, and biasing one or more word line conductors 335 may support evaluating (e.g., determining) a conductivity of one or more pillars 375 to read one or more associated memory cells 205. Word line conductors 335 also may be operable to pump (e.g., trap) a charge in one or more portions of a charge trapping material (e.g., a portion of a charge trapping material associated with a memory cell 205, a charge trapping structure) to store a logic state in one or more memory cells 205, or to erase one or more memory cells 205, among other operations.

The memory architecture 300 also may include contacts 330 (e.g., electrical contacts, vertical electrodes) extending along the z-direction. For example, the contacts 330 may be formed over (e.g., on, through, around) the stack 320, where, in some examples, portions of material 365 may be removed to form cavities and one or more electrode materials (e.g., one or more conductive materials) may be deposited in the cavities. In some examples, a dielectric material may be formed (e.g., conformally deposited) in the cavities before an electrode material of the contacts 330 is deposited in the cavities. The dielectric material may act as an insulator between the contacts 330 and materials (e.g., conductors) coincident with the walls of the cavities, and may prevent unintended conductivity between the contacts 330 and other portions of the memory architecture 300.

In some cases, contacts 330 may provide structural support for the materials of or around the word line conductors 335, among other structures. For example, contacts 330 located in the region 350 (e.g., the staircase region) may provide support to the staircase structure 360 (e.g., and also to the overall memory architecture 300), along the z-direction, such as when layers of the material 365 are removed from one or more of the regions located near the staircase structure 360 or during formation of the staircase structure 360 itself. In some other examples, one or more of the contacts 330 may be formed through the stack 320 and may couple with (e.g., electrically couple, physically couple) circuitry 310 beneath the stack 320. For example, contacts 330 located in the region 345 (e.g., the island region) may be coupled with the circuitry 310, such that the circuitry 310 may apply voltage to one or more contacts 330 in the region 345. Based on the voltage applied by the circuitry 310, the contacts 330 in the region 345 may apply a voltage to one or more associated connective lines 380, based on a voltage being applied to the contacts 330 by the circuitry 310. In some examples, at least a portion of the connective lines 380 may be included in a routing level (e.g., a routing layer, a metal layer, a trace layer, a redistribution layer (RDL), not shown).

In some examples, one or more connective lines 380 of the region 345 may be coupled with one or more respective contacts 370 (e.g., and thereby to one or more respective word line conductors 335) of the staircase structure 360. Additionally, or alternatively, one or more connective lines 380 of the region 345 may be coupled with one or more respective pillars 375 of the region 340 (e.g., where a connective line 380 may be an example of a bit line 250). Thus, the connective lines 380 may support biasing word line conductors 335 via contacts 330, biasing pillars 375 via contacts 330, or a combination thereof.

In some examples, one or more defects may be associated with the formation of the memory architecture 300. For example, forming the contacts 330 may include removing (e.g., via recessing, via dry etching) a portion of various materials (e.g., material 365, portions of the stack 320) from the region 350 and the region 345 until a portion of the stack 320 is reached (e.g., the stack 320 or a portion thereof may act as an etch stop). In some cases, during removal of one or more such materials, structural defects may occur. For example, one or more of the etching operations associated with formation of the contacts 330, the contacts 370, or both, may be aligned with one or more of the discontinuities 355 (e.g., along the x-direction, along the y-direction). As such, an etching operation associated with the contacts 330, the contacts 370, or both, may not stop at the stack 320 but may etch one or more portions of the memory architecture 300 that is below the stack 320 (e.g., portions of the memory architecture 300 not intended to be etched). Additionally, or alternatively, the contacts 330 or the contacts 370 may induce structural defects (e.g., bending, buckling, stress, deflection) in one or more of the word line conductors 335 located above respective discontinuities 355 (e.g., above a discontinuity 355-c, or other discontinuity 355 in the region 350) because of reduced structural support (e.g., a lack of structural support) below a location at which a respective contact 370 may apply force to an associated word line conductor 335.

In accordance with examples as disclosed herein, manufacturing processes may be configured such that fewer of the discontinuities 355 are introduced in the stack 320, supporting a reduction of unintended etching, or a reduction in structural defects of one or more word line conductors 335, or both. For example, at least a portion of the stack 320 in the region 350 (e.g., among other regions) may be configured to be continuous (e.g., uninterrupted), such as implementing fewer discontinuities 355 (e.g., gaps) in the stack 320 in the region 350 (e.g., fewer discontinuities 355, or no discontinuities 355, such as omitting the discontinuity 355-c). In some examples, this portion of the stack 320 may be associated with the contacts 370 and the word line conductors 335 of the staircase structure 360 and, in some cases, may also extend beyond a region below the word line staircase structure 360 (e.g., in one or more directions). Such configurations may support fewer discontinuities 355 (e.g., fewer physical interruptions) in the stack 320, which may reduce unintended etching below the stack 320, and may reduce structural defects in the word line conductors 335 of the word line staircase structure 360.

Figure 4:
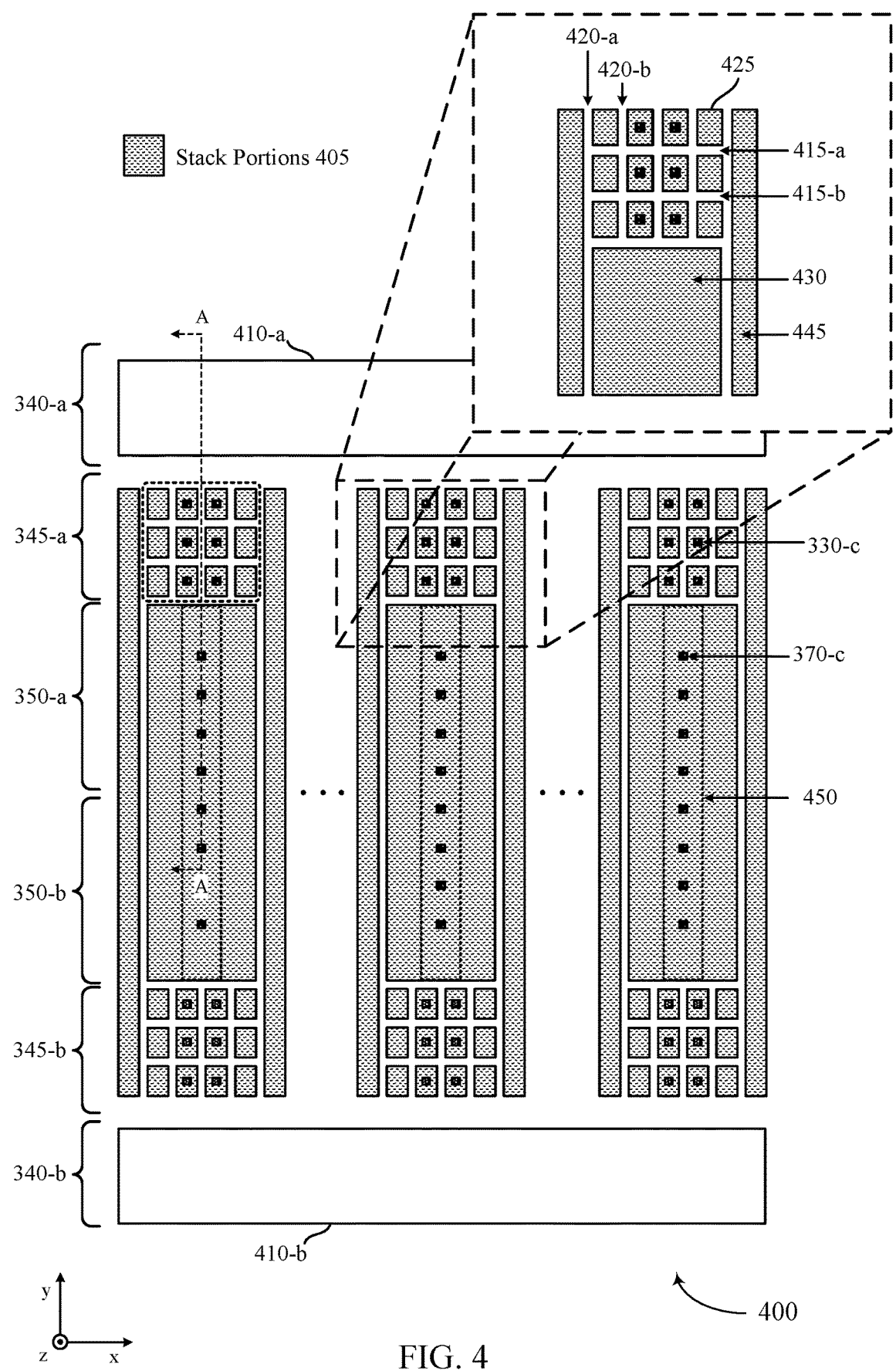
FIG. 4 illustrates an example of a memory architecture that supports support structures for three dimensional memory arrays in accordance with examples as disclosed herein.

FIG. 4 illustrates an example of a memory architecture 400 that supports support structures for three dimensional memory arrays in accordance with examples as disclosed herein. The memory architecture 400 may be an example for implementing aspects of a memory device 100, a memory architecture 200, or a memory architecture 300 described with reference to FIGS. 1, 2, and 3, respectively. For illustrative purposes, aspects of the memory architecture 400 may be described with reference to an x-direction, a y-direction, and a z-direction of the illustrated coordinate system, which may generally correspond to the x-direction, y-direction, and z-direction described with reference to FIG. 3. For example, the memory architecture 400 may represent an example of a top view of the memory architecture 300, where the memory architecture 300 may be illustrative of a cross-sectional view relative to the cut plane A-A, or portions thereof. Some elements of the memory architecture 400, or elements associated with the memory architecture 400, may be omitted for the sake of visibility and clarity of the depicted elements. Moreover, although some elements included in FIG. 4 are labeled with reference numbers, some other corresponding elements are not labeled, though they are the same or would be understood by a person of ordinary skill in the art to be similar.

The memory architecture 400 illustrates an example of stack portions 405 (e.g., portions of a stack 320) that may be included in regions 345 and regions 350, and memory arrays 410 (e.g., a memory array 410-a and a memory array 410-b), each of which may be located in a respective region 340. The memory architecture 400 may include a substrate (not shown) over which the memory arrays 410 and the stack portions 405 are formed. The stack portions 405 may include portions (e.g., isolated portions) of one or more conductor layers of a stack 320 (e.g., a layer of material 325) that, in the regions 340, may support a source (e.g., a source node, a source plate) for a respective memory array 410 (e.g., memory array 410-a in regions 340-a, memory array 410 in region 340-b) and, in other regions (e.g., at least regions 350), may be electrically floating. Word line conductors (not illustrated), which may be operable to access associated memory cells 205, may be formed within the memory arrays 410 and extend over at least some of the stack portions 405 (e.g., into regions 350-a and 350-b).

In some examples, after forming a stack 320, stack portions 405 may be formed in various patterns via material removal operations (e.g., etching operations, trenching operations). For example, the removal operations may include forming discontinuities in the stack 320 by removing materials of the stack 320 from a perimeter around the stack portions 405. In some examples, the discontinuities may include trenches 415 (e.g., a trench 415-a, a trench 415-b) extending along the x-direction and trenches 420 (e.g., a trench 420-a, a trench 420-b) extending along the y-direction, such that one or more portions of the stack 320 may be separated into islands 425 (e.g., relatively smaller islands, located in regions 345, located in one or more island regions) arranged along one or more directions in an xy-plane. However, in some examples, a portion of the stack 320 may not be etched (e.g., or may have less etching performed) after being formed, thus resulting in an island 430 (e.g., a relatively large island, located in or across regions 350, associated with a staircase region 450 that may include one or more staircase structures 360). In some examples, multiple regions 350 associated with one or more common (e.g., spanning) islands 430 may be referred to as a same (e.g., common) region.

In some examples, the islands 425 may each be associated with a respective shorter (e.g., smaller) length dimension (e.g., along the y-direction), respective shorter width dimension (e.g., along the x-direction), or both, in comparison to corresponding length and width dimensions of the island 430. In some examples, the length dimension (e.g., along the y-direction) of the island 430 may be larger than the width dimension (e.g., along the x-direction) of the island 430. In some examples, the length dimension (e.g., along the y-direction) of a respective island 425 may be larger than the width dimension (e.g., along the x-direction) of the island 425. In some examples, islands 425 (e.g., a region 345) may be located between (e.g., adjacent to) a memory array 410 (e.g., a region 340) and a portion of the island 430 (e.g., a respective regions 350), along the y-direction.

In some examples, one or more contacts 370 (e.g., word line contacts, electrical contacts) may be formed over a portion of the stack portions 405 in the regions 350 (e.g., over the islands 430). For example, as described with reference to FIG. 3, the contacts 370 may be formed along the z-direction over the substrate and over the island 430. The contacts 370 may be electrically coupled with respective word line conductors 335 and may be utilized, together with the respective word line conductors 335, in accessing one or more of the memory cells 205 of the corresponding memory array 410. For example, word line conductors 335 associated with a staircase structure 360 over a first half of an island 430 (e.g., of a region 350-a, a top half along the y-direction) may extend along the y-direction into the memory array 410-a and may be operable to access one or more of the memory cells 205 of the memory array 410-a. In some examples, word line conductors 335 associated with staircase structures 360 over a second half of an island 430 (e.g., of the region 350-b, a bottom half along the y-direction) may extend along the y-direction into the memory array 410-b and may be operable to access one or more of the memory cells 205 of the memory array 410-b.

In some examples, the various regions may expand beyond what is depicted in FIG. 3, as shown by FIG. 4. For example, the island 430 may extend along the y-direction beyond that which is illustrated in FIG. 3. As such, the regions 350 (e.g., associated with the staircase region 450) may be respectively greater (e.g., larger) along the y-direction than shown in FIG. 3. For example, an additional set of islands 425 may be located between (e.g., adjacent to) the island 430 and the memory array 410-b along the y-direction (e.g., in the region 345-b). As such, descriptions of word lines, word line contacts, and other components and connections as discussed with reference to the cross-section A-A may similarly be associated with another portion of the island 430, the set of islands 425, the memory array 410-b, or a combination thereof.

In some examples, one or more islands 445 of the stack 320 may be located on either side (e.g., along the x-direction) of the sets of islands 425 and the island 430, and may extend a full length of the islands along the y-direction. In some examples, various configurations (e.g., quantities, sizes, layouts, widths) of the stack portions 405 (e.g., configurations of the islands 425, the islands 430, the islands 445) may be utilized in conjunction with the memory array 410-a and the memory array 410-b, as illustrated, and described further with reference to, FIGS. 5A-5D.

FIGS. 5A through 5D illustrate examples of material arrangements 500-a, 500-b, 500-c, and 500-d supporting support structures for three dimensional memory arrays in accordance with examples as disclosed herein. For example, FIGS. 5A through 5D may illustrate alternative configurations of a stack of material layers (e.g., islands of a stack 320) that may be implemented in memory architectures 300 and 400 as described with reference to FIGS. 3 and 4. Each of the material arrangements 500 illustrates a different arrangement of stack portions 505 (e.g., portions of a stack 320) that may be formed over a substrate 305 in regions 345 and regions 350, which may be examples of the respective regions described with reference to FIGS. 3 and 4. Each view of the figures may be described with reference to an x-direction, a y-direction, and a z-direction as illustrated, which may correspond to the respective directions described with reference to the memory architecture 200, memory architecture 300, or both. Although FIGS. 5A through 5D depict certain examples of island arrangements, it should be noted that other arrangements may be implemented in accordance with the examples of techniques disclosed herein.

As illustrated, regions 350, or a combination of regions 350 may include or be otherwise associated with islands 525, which may be relatively large stack portions 505 (e.g., a portion of a stack 320 associated with no discontinuities or relatively few discontinuities) that may span one or more regions 350 (e.g., along the y-direction). The islands 525 may be located between staircase structures 360 and a substrate 305. Further, at least regions 345 and, in some examples, regions 350 (e.g., outside the extents in an xy-plane of staircase structures 360), may include or be otherwise associated with islands 520, which may be relatively small stack portions 505. Further, in some examples, the regions 345 and 350, may include or be otherwise associated with islands 530, which may be stack portions 505 that span regions 345 and 350 (e.g., along the y-direction, between regions 340, not shown).

FIG. 5A illustrates an example of a material arrangement 500-a as a result of various manufacturing operations (e.g., additive operations, subtractive operations), as described with reference to FIGS. 3 and 4. In some examples, removal (e.g., etching) operations may be performed on a stack 320 to form discontinuities in the stack 320 along one or more directions in an xy-plane. The discontinuities may include trenches extending along both the x-direction (e.g., trench 510-a, trench 510-b) and y-direction (e.g., trench 515-a, trench 515-b), such that a portion of the stack 320 may be separated into islands 520. For example, a portion of the stack 320 may be etched such that this portion may contain discontinuities along the xy-plane, where the discontinuities may define the islands 520. However, in some other examples, a portion of the stack 320 may not be etched after being formed, thus resulting in an island 525 (e.g., a relatively large stack portion 505).

The material arrangement 500-a illustrates an example in which islands 520 may be formed such that they border the island 525 (e.g., along one or more sides in an xy-plane). For example, the stack portions 505 may be formed such that sets of four of the islands 520 may be included along the x-direction in the regions 345, and such that the width of the island 525 in the y-direction may be associated with a width of two of the islands 520. In some examples, a set of islands 520 along the y-direction, having a width of one island 520, may be located along each side of the island 525. In some examples, the islands 520 may each be associated with a respective shorter (e.g., smaller) length dimension (e.g., along the y-direction), shorter width dimension (e.g., along the x-direction), or both than the length and width dimensions of the island 525, respectively. In some examples, the length dimension (e.g., along the y-direction) of the island 525 may be larger than the width dimension (e.g., along the x-direction) of the island 525. In some examples, the length dimension (e.g., along the y-direction) of an island 520 may be larger than the width dimension (e.g., along the x-direction) of the island 520. In some examples, one or more islands 530 of the stack 320 may be located on either side of the arrangement of islands 520 and the island 525 and may extend the full length of the material arrangement 500-a along the y-direction. In various examples, the material arrangement 500-a may be implemented with different quantities of islands 520 along the x-direction, along the y-direction, or both.

FIG. 5B illustrates an example of a material arrangement 500-b resulting from various manufacturing operations (e.g., deposition operations, etching operations). In the example of material arrangement 500-b, the stack portions 505 may be formed such that sets of three of the islands 520 may be included along the x-direction in the regions 345, such that the width of the island 525 may be associated with the width of one island 520. In some examples, a set of islands 520 along the y-direction, having a width of one island 520, may be located along each side of the island 525. In some cases, the width of the island 525 may be associated with the width of one or three of the islands 520.

FIG. 5C illustrates an example of a material arrangement 500-c resulting from various manufacturing operations (e.g., deposition operations, etching operations). In the example of material arrangement 500-c, the stack portions 505 may be formed such that sets of two of the islands 520 may be included along the x-direction in the region 345 and such that the width of the island 525 may be associated with the width of two of the islands 520.

FIG. 5D illustrates an example of a material arrangement 500-d resulting from various manufacturing operations (e.g., deposition operations, etching operations). In the example of material arrangement 500-d, the stack portions 505 may be formed such that five of the islands 520 may be included along the x-direction in the region 345, such that the width of the island 525 may be associated with the width of three of the islands 520. In some examples, a set of islands 520 along the y-direction, having a width of one island 520, may be located along each side of the island 525.

Thus, according to these and other examples, relatively larger islands 525 may be formed between staircase structures 360 and a substrate 305 (e.g., along the z-direction), which may improve structural stability during and after manufacturing of a memory die that implements the described material arrangements, which may accordingly improve process uniformity and manufacturing yield. Further, relatively smaller islands 520 may be implemented in other regions, such as regions that support the formation of contacts 330, which may enable at least some contacts 330 to be formed (e.g., through respective islands 520) without depositing a dielectric material in a formed cavity and still maintain electrical isolation from other structures. Such techniques may leverage aspects of at least a common metal layer formed over a substrate 305 that additionally supports a source (e.g., a source node, one or more source lines 260) of a memory array.

Figure 6:
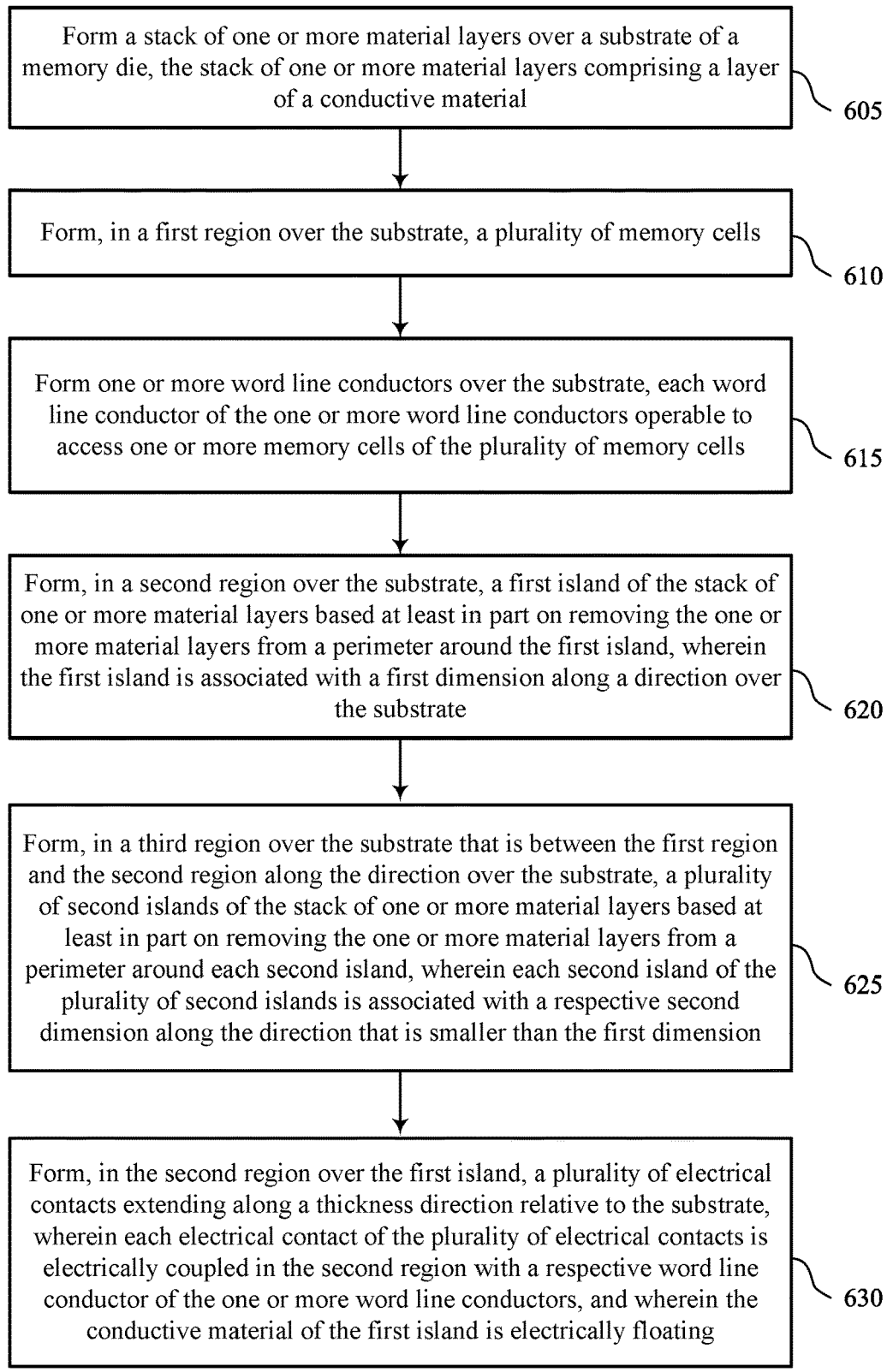
FIG. 6 shows a flowchart illustrating a method or methods supporting support structures for three dimensional memory arrays in accordance with examples as disclosed herein.

FIG. 6 shows a flowchart illustrating a method 600 that supports support structures for three dimensional memory arrays in accordance with examples as disclosed herein. The operations of method 600 may be implemented by a manufacturing system or its components as described herein. For example, the operations of method 600 may be performed by a manufacturing system and as described with reference to FIGS. 1 through 5D. In some examples, a manufacturing system may execute a set of instructions to control the functional elements of a device to perform the described functions. Additionally, or alternatively, the manufacturing system may perform aspects of the described functions using special-purpose hardware.

At 605, the method may include forming a stack of one or more material layers over a substrate of a memory die, the stack of one or more material layers including a layer of a conductive material. The operations of 605 may be performed in accordance with examples as disclosed herein.

At 610, the method may include forming, in a first region over the substrate, a plurality of memory cells. The operations of 610 may be performed in accordance with examples as disclosed herein.

At 615, the method may include forming one or more word line conductors over the substrate, each word line conductor of the one or more word line conductors operable to access one or more memory cells of the plurality of memory cells. The operations of 615 may be performed in accordance with examples as disclosed herein.

At 620, the method may include forming, in a second region over the substrate, a first island of the stack of one or more material layers based at least in part on removing the one or more material layers from a perimeter around the first island, where the first island is associated with a first dimension along a direction over the substrate. The operations of 620 may be performed in accordance with examples as disclosed herein.

At 625, the method may include forming, in a third region over the substrate that is between the first region and the second region along the direction over the substrate, a plurality of second islands of the stack of one or more material layers based at least in part on removing the one or more material layers from a perimeter around each second island, where each second island of the plurality of second islands is associated with a respective second dimension along the direction that is smaller than the first dimension. The operations of 625 may be performed in accordance with examples as disclosed herein.

At 630, the method may include forming, in the second region over the first island, a plurality of electrical contacts extending along a thickness direction relative to the substrate, where each electrical contact of the plurality of electrical contacts is electrically coupled in the second region with a respective word line conductor of the one or more word line conductors, and where the conductive material of the first island is electrically floating. The operations of 630 may be performed in accordance with examples as disclosed herein.

In some examples, an apparatus (e.g., one or more apparatuses of a manufacturing system, one or more components of a manufacturing system) as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for forming a stack of one or more material layers over a substrate of a memory die, the stack of one or more material layers including a layer of a conductive material; forming, in a first region over the substrate, a plurality of memory cells; forming one or more word line conductors over the substrate, each word line conductor of the one or more word line conductors operable to access one or more memory cells of the plurality of memory cells; forming, in a second region over the substrate, a first island of the stack of one or more material layers based at least in part on removing the one or more material layers from a perimeter around the first island, where the first island is associated with a first dimension along a direction over the substrate; forming, in a third region over the substrate that is between the first region and the second region along the direction over the substrate, a plurality of second islands of the stack of one or more material layers based at least in part on removing the one or more material layers from a perimeter around each second island, where each second island of the plurality of second islands is associated with a respective second dimension along the direction that is smaller than the first dimension; and forming, in the second region over the first island, a plurality of electrical contacts extending along a thickness direction relative to the substrate, where each electrical contact of the plurality of electrical contacts is electrically coupled in the second region with a respective word line conductor of the one or more word line conductors, and where the conductive material of the first island is electrically floating.

Aspect 2: The method, apparatus, or non-transitory computer-readable medium of aspect 1, where forming the plurality of memory cells includes operations, features, circuitry, logic, means, or instructions, or any combination thereof for forming, in the first region over the substrate, a plurality of pillars over the substrate, each pillar of the plurality of pillars including a semiconductor material operable to couple with the conductive material in the first region, where each word line conductor of the one or more word line conductors is operable to modulate a conductivity of a respective portion of the semiconductor material of at least one pillar of the plurality of pillars.

Aspect 3: The method, apparatus, or non-transitory computer-readable medium of aspect 2, further including operations, features, circuitry, logic, means, or instructions, or any combination thereof for forming, in the first region over the substrate, a third island of the stack of one or more material layers based at least in part on removing the one or more material layers from a perimeter around the third island, where the semiconductor material of each pillar of the plurality of pillars is operable to couple with the conductive material of the third island.

Aspect 4: The method, apparatus, or non-transitory computer-readable medium of any of aspects 1 through 3, where at least a subset of the one or more word line conductors is arranged along the thickness direction.

Aspect 5: The method, apparatus, or non-transitory computer-readable medium of any of aspects 1 through 4, further including operations, features, circuitry, logic, means, or instructions, or any combination thereof for forming, in a fourth region over the substrate, a second plurality of memory cells; forming one or more second word line conductors over the substrate, each second word line conductor of the one or more second word line conductors operable to access one or more memory cells of the second plurality of memory cells; forming, in a fifth region over the substrate that is between the fourth region and the second region along the direction over the substrate, a plurality of third islands of the stack of one or more material layers based at least in part on removing the one or more material layers from a perimeter around each third island, where each third island of the plurality of third islands is associated with a respective third dimension along the direction that is smaller than the first dimension; and forming, in the second region over the first island, a plurality of second electrical contacts extending along the thickness direction, where each second electrical contact of the plurality of second electrical contacts is electrically coupled in the second region with a respective second word line conductor of the one or more second word line conductors.

Aspect 6: The method, apparatus, or non-transitory computer-readable medium of any of aspects 1 through 5, where removing the one or more material layers from the perimeter around each second island includes operations, features, circuitry, logic, means, or instructions, or any combination thereof for forming a plurality of first trenches each extending through the stack of one or more material layers and each extending along the direction and forming a plurality of second trenches each extending through the stack of one or more material layers and each extending along a second direction over the substrate.

Aspect 7: The method, apparatus, or non-transitory computer-readable medium of any of aspects 1 through 6, further including operations, features, circuitry, logic, means, or instructions, or any combination thereof for forming a plurality of third electrical contacts in the third region, where each third electrical contact of the plurality of third electrical contacts extends along the thickness direction and is electrically coupled with the conductive material of a respective second island of the plurality of second islands.

Aspect 8: The method, apparatus, or non-transitory computer-readable medium of any of aspects 1 through 7, further including operations, features, circuitry, logic, means, or instructions, or any combination thereof for forming, in the second region over the substrate, a plurality of fourth islands of the stack of one or more material layers based at least in part on removing the one or more material layers from a perimeter around each fourth island, where each fourth island of the plurality of fourth islands is associated with a respective fourth dimension along the direction that is smaller than the first dimension.

Aspect 9: The method, apparatus, or non-transitory computer-readable medium of aspect 8, where a first subset of the plurality of fourth islands is adjacent to a first side of first island along a second direction over the substrate and a second subset of the plurality of fourth islands is adjacent to a second side of the first island along the second direction.

Aspect 10: The method, apparatus, or non-transitory computer-readable medium of any of aspects 1 through 9, where the first island is associated with a fifth dimension along a second direction over the substrate and each second island of the plurality of second islands is associated with a respective sixth dimension along the second direction that is smaller than the fifth dimension.

Aspect 11: The method, apparatus, or non-transitory computer-readable medium of any of aspects 1 through 10, where the one or more material layers include one or more additional material layers over the layer of the conductive material.

Aspect 12: The method, apparatus, or non-transitory computer-readable medium of any of aspects 1 through 11, where the plurality of second islands includes one or more rows of second islands arranged along a second direction over the substrate.

It should be noted that the described methods include possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 13: An apparatus, including: a substrate; a plurality of memory cells in a first region over the substrate; one or more word line conductors over the substrate, each word line conductor of the one or more word line conductors operable to access one or more memory cells of the plurality of memory cells; a first island of a stack of one or more material layers in a second region over the substrate, the stack of one or more material layers including a layer of a conductive material, where the first island is associated with a first dimension along a direction over the substrate, and where the conductive material of the first island is electrically floating; a plurality of second islands of the stack of one or more material layers in a third region over the substrate between the first region and the second region along the direction over the substrate, where each second island of the plurality of second islands is associated with a respective second dimension along the direction that is smaller than the first dimension; and a plurality of electrical contacts in the second region over the first island, each electrical contact of the plurality of electrical contacts extending along a thickness direction relative to the substrate and electrically coupled in the second region with a respective word line conductor of the one or more word line conductors.

Aspect 14: The apparatus of aspect 13, where the plurality of memory cells includes: a plurality of pillars in the first region over the substrate, each pillar of the plurality of pillars including a semiconductor material operable to couple with the conductive material in the first region, where each word line conductor of the one or more word line conductors is operable to modulate a conductivity of a respective portion of the semiconductor material of at least one pillar of the plurality of pillars.

Aspect 15: The apparatus of aspect 14, further including: a third island of the stack of one or more material layers in the first region over the substrate, where the semiconductor material of each pillar of the plurality of pillars is operable to couple with the conductive material of the third island.

Aspect 16: The apparatus of any of aspects 13 through 15, where at least a subset of the one or more word line conductors arranged along the thickness direction.

Aspect 17: The apparatus of any of aspects 13 through 16, further including: a second plurality of memory cells in a fourth region over the substrate; one or more second word line conductors over the substrate, each second word line conductor of the one or more second word line conductors operable to access one or more memory cells of the second plurality of memory cells; a plurality of third islands of the stack of one or more material layers in a fifth region over the substrate that is between the fourth region and the second region along the direction over the substrate, where each third island of the plurality of third islands is associated with a respective third dimension along the direction that is smaller than the first dimension; and a plurality of second electrical contacts in the second region over the first island and extending along the thickness direction, where each second contact of the plurality of second electrical contacts is electrically coupled in the second region with a respective second word line conductor of the one or more second word line conductors.

Aspect 18: The apparatus of any of aspects 13 through 17, further including: a plurality of third electrical contacts in the third region, where each third electrical contact of the plurality of third electrical contacts extends along the thickness direction and is electrically coupled with the conductive material of a respective second island of the plurality of second islands.

Aspect 19: The apparatus of aspect 18, where at least one third electrical contact of the plurality of third electrical contacts is coupled with an electrical contact of the plurality of electrical contacts.

Aspect 20: The apparatus of any of aspects 18 through 19, where at least one third electrical contact of the plurality of third electrical contacts is operable to electrically couple with a memory cell of the plurality of memory cells.

Aspect 21: The apparatus of any of aspects 18 through 20, where at least one third electrical contact of the plurality of third electrical contacts is electrically coupled with circuitry of the substrate that is operable to access the plurality of memory cells.

Aspect 22: The apparatus of any of aspects 13 through 21, further including: a plurality of fourth islands of the stack of one or more material layers in the second region over the substrate, where each fourth island of the plurality of fourth islands is associated with a respective fourth dimension along the direction that is smaller than the first dimension.

Aspect 23: The apparatus of aspect 22, where a first subset of the plurality of fourth islands is adjacent to a first side of first island along a second direction over the substrate and a second subset of the plurality of fourth islands is adjacent to a second side of the first island along the second direction.

Aspect 24: The apparatus of any of aspects 13 through 23, where: the first island is associated with a fifth dimension along a second direction over the substrate; and each second island of the plurality of second islands is associated with a respective sixth dimension along the second direction that is smaller than the fifth dimension.

An apparatus is described. The following provides an overview of aspects of the apparatus as described herein:

Aspect 25: An apparatus formed by a process including: forming a stack of one or more material layers over a substrate of a memory die, the stack of one or more material layers including a layer of a conductive material; forming, in a first region over the substrate, a plurality of memory cells; forming one or more word line conductors over the substrate, each word line conductor of the one or more word line conductors operable to access one or more memory cells of the plurality of memory cells; forming, in a second region over the substrate, a first island of the stack of one or more material layers based at least in part on removing the one or more material layers from a perimeter around the first island, where the first island is associated with a first dimension along a direction over the substrate; forming, in a third region over the substrate that is between the first region and the second region along the direction over the substrate, a plurality of second islands of the stack of one or more material layers based at least in part on removing the one or more material layers from a perimeter around each second island, where each second island of the plurality of second islands is associated with a respective second dimension along the direction that is smaller than the first dimension; and forming, in the second region over the first island, a plurality of electrical contacts extending along a thickness direction relative to the substrate, where each electrical contact of the plurality of electrical contacts is electrically coupled in the second region with a respective word line conductor of the one or more word line conductors, and where the conductive material of the first island is electrically floating.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials, or combinations thereof. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally, or alternatively (e.g., in an alternative example), be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
    forming a stack of one or more material layers over a substrate of a memory die, the stack of one or more material layers comprising a layer of a conductive material;
    forming, in a first region over the substrate, a plurality of memory cells;
    forming one or more word line conductors over the substrate, each word line conductor of the one or more word line conductors operable to access one or more memory cells of the plurality of memory cells;
    forming, in a second region over the substrate, a first island of the stack of one or more material layers based at least in part on removing the one or more material layers from a perimeter around the first island, wherein the first island is associated with a first dimension along a direction over the substrate;
    forming, in a third region over the substrate that is between the first region and the second region along the direction over the substrate, a plurality of second islands of the stack of one or more material layers based at least in part on removing the one or more material layers from a perimeter around each second island, wherein each second island of the plurality of second islands is associated with a respective second dimension along the direction that is smaller than the first dimension; and
    forming, in the second region over the first island, a plurality of electrical contacts extending along a thickness direction relative to the substrate, wherein each electrical contact of the plurality of electrical contacts is electrically coupled in the second region with a respective word line conductor of the one or more word line conductors, and wherein the conductive material of the first island is electrically floating.

2. The method of claim 1, wherein forming the plurality of memory cells comprises:
    forming, in the first region over the substrate, a plurality of pillars over the substrate, each pillar of the plurality of pillars comprising a semiconductor material operable to couple with the conductive material in the first region, wherein each word line conductor of the one or more word line conductors is operable to modulate a conductivity of a respective portion of the semiconductor material of at least one pillar of the plurality of pillars.

3. The method of claim 2, further comprising:
forming, in the first region over the substrate, a third island of the stack of one or more material layers based at least in part on removing the one or more material layers from a perimeter around the third island, wherein the semiconductor material of each pillar of the plurality of pillars is operable to couple with the conductive material of the third island.

4. The method of claim 1, wherein at least a subset of the one or more word line conductors is arranged along the thickness direction.

5. The method of claim 1, further comprising:
forming, in a fourth region over the substrate, a second plurality of memory cells;
forming one or more second word line conductors over the substrate, each second word line conductor of the one or more second word line conductors operable to access one or more memory cells of the second plurality of memory cells;
forming, in a fifth region over the substrate that is between the fourth region and the second region along the direction over the substrate, a plurality of third islands of the stack of one or more material layers based at least in part on removing the one or more material layers from a perimeter around each third island, wherein each third island of the plurality of third islands is associated with a respective third dimension along the direction that is smaller than the first dimension; and
forming, in the second region over the first island, a plurality of second electrical contacts extending along the thickness direction, wherein each second electrical contact of the plurality of second electrical contacts is electrically coupled in the second region with a respective second word line conductor of the one or more second word line conductors.

6. The method of claim 1, wherein removing the one or more material layers from the perimeter around each second island comprises:
forming a plurality of first trenches each extending through the stack of one or more material layers and each extending along the direction; and
forming a plurality of second trenches each extending through the stack of one or more material layers and each extending along a second direction over the substrate.

7. The method of claim 1, further comprising:
forming a plurality of third electrical contacts in the third region, wherein each third electrical contact of the plurality of third electrical contacts extends along the thickness direction and is electrically coupled with the conductive material of a respective second island of the plurality of second islands.

8. The method of claim 1, further comprising:
forming, in the second region over the substrate, a plurality of fourth islands of the stack of one or more material layers based at least in part on removing the one or more material layers from a perimeter around each fourth island, wherein each fourth island of the plurality of fourth islands is associated with a respective fourth dimension along the direction that is smaller than the first dimension.

9. The method of claim 8, wherein a first subset of the plurality of fourth islands is adjacent to a first side of first island along a second direction over the substrate and a second subset of the plurality of fourth islands is adjacent to a second side of the first island along the second direction.

10. The method of claim 1, wherein:
the first island is associated with a fifth dimension along a second direction over the substrate; and
each second island of the plurality of second islands is associated with a respective sixth dimension along the second direction that is smaller than the fifth dimension.

11. The method of claim 1, wherein the one or more material layers comprise one or more additional material layers over the layer of the conductive material.

12. The method of claim 1, wherein the plurality of second islands comprises one or more rows of second islands arranged along a second direction over the substrate.

* * * * *